United States Patent
Wang et al.

(10) Patent No.: US 12,197,839 B1
(45) Date of Patent: Jan. 14, 2025

(54) QUICK SIMULATION AND OPTIMIZATION METHOD AND SYSTEM FOR ANALOG CIRCUITS

(71) Applicant: Faraday Dynamics. Ltd., Hangzhou (CN)

(72) Inventors: Gaofeng Wang, Hangzhou (CN); Yanzhu Qi, Hangzhou (CN)

(73) Assignee: Faraday Dynamics. Ltd., Hangzhou (CN)

( * ) Notice: Subject to any disclaimer, the term of this patent is extended or adjusted under 35 U.S.C. 154(b) by 0 days.

(21) Appl. No.: 18/823,587

(22) Filed: Sep. 3, 2024

Related U.S. Application Data

(63) Continuation of application No. PCT/CN2022/090043, filed on Apr. 28, 2022.

(30) Foreign Application Priority Data

Apr. 25, 2022 (CN) .......................... 202210439728.9

(51) Int. Cl.
  *G06F 30/373* (2020.01)
  *G06F 30/3308* (2020.01)
  (Continued)

(52) U.S. Cl.
  CPC .......... *G06F 30/373* (2020.01); *G06F 30/367* (2020.01); *G06F 30/3308* (2020.01);
  (Continued)

(58) Field of Classification Search
  CPC .... G06F 30/373; G06F 30/367; G06F 30/398; G06F 30/337; G06F 30/3308; G06F 30/27; G06N 5/00; G06N 7/023; G06N 20/00
  (Continued)

(56) References Cited

U.S. PATENT DOCUMENTS 8,516,429 B2 * 8/2013 Wu .................. G06F 30/367
  716/132
2002/0156609 A1 10/2002 Hirata et al.
  (Continued)

FOREIGN PATENT DOCUMENTS

CN    102508977 A  *  6/2012
CN    106547962 A     3/2017
  (Continued)

OTHER PUBLICATIONS

Machine English Translation of Chinese Patent Document No. CN-111539178A, published on Aug. 14, 2020, machine translated by European Patent Office Patent Translate, machine translated on Oct. 18, 2024, 13 pages. (Year: 2024).*
(Continued)

*Primary Examiner* — Phallaka Kik

(57) ABSTRACT

Disclosed are a quick simulation and optimization method and system for analog circuits. Aiming at a problem that a customized circuit model is difficultly modeled in a design process of the analog circuit, and the problem of a low circuit design efficiency caused by a slow electromagnetic field simulation speed, the invention proposes to firstly construct a device library, build a circuit and interconnect an AI network to obtain a comprehensive network parameter of the AI network; the comprehensive network parameter in a simulation process is compared with a network parameter target of an analog circuit, and an circuit layout of the analog circuit corresponding to the AI network is output to a three-dimensional full-wave electromagnetic field simulation tool for simulation and verification when requirements are met.

10 Claims, 1 Drawing Sheet

(51) Int. Cl.
*G06F 30/337* (2020.01)
*G06F 30/367* (2020.01)
*G06F 30/398* (2020.01)
*G06N 5/00* (2023.01)
*G06N 7/00* (2023.01)
*G06N 20/00* (2019.01)
*G06N 7/02* (2006.01)

(52) U.S. Cl.
CPC .......... *G06F 30/337* (2020.01); *G06F 30/398* (2020.01); *G06N 5/00* (2013.01); *G06N 7/023* (2013.01); *G06N 20/00* (2019.01)

(58) Field of Classification Search
USPC ........... 716/103, 106, 111, 132, 136; 703/15
See application file for complete search history.

(56) References Cited

U.S. PATENT DOCUMENTS

| | | | | |
|---|---|---|---|---|
| 2013/0311152 | A1* | 11/2013 | Walker | G06F 30/367 |
| | | | | 703/4 |
| 2019/0042684 | A1* | 2/2019 | Toub | G06F 30/398 |
| 2020/0250585 | A1* | 8/2020 | Liu | G06N 20/00 |
| 2022/0004900 | A1* | 1/2022 | Salahuddin | G06N 3/08 |
| 2022/0092246 | A1 | 3/2022 | Abbas et al. | |
| 2024/0028803 | A1* | 1/2024 | Wolf | G06F 30/333 |

FOREIGN PATENT DOCUMENTS

| | | | | | |
|---|---|---|---|---|---|
| CN | 108268687 | A | | 7/2018 | |
| CN | 109977534 | A | * | 7/2019 | |
| CN | 110502837 | A | | 11/2019 | |
| CN | 111539178 | A | | 8/2020 | |
| CN | 112417803 | A | | 2/2021 | |
| CN | 110245436 | B | * | 3/2021 | ........... G06F 30/367 |
| CN | 112507657 | A | | 3/2021 | |
| CN | 108268687 | B | * | 6/2021 | ............ G06F 30/20 |
| CN | 112883672 | A | | 6/2021 | |
| CN | 113158608 | A | | 7/2021 | |
| CN | 113361223 | A | | 9/2021 | |
| CN | 113392608 | A | | 9/2021 | |
| CN | 114510900 | A | * | 5/2022 | ........... G06F 30/394 |
| CN | 114861586 | A | * | 8/2022 | |
| CN | 116050331 | A | * | 5/2023 | |

OTHER PUBLICATIONS

Machine English Translation of Chinese Patent Document No. CN-108268687A published on Jul. 10, 2018, machine translated by European Patent Office Patent Translate, machine translated on Oct. 18, 2024, 11 pages. (Year: 2024).*

Machine English Translation of Chinese Patent Document No. CN-113158608A, published on Jul. 23, 2021, machine translated by European Patent Office Patent Translate, machine translated on Oct. 18, 2024, 26 pages. (Year: 2024).*

Internation Search Report of PCT/CN2022/090043, Mailed Apr. 28, 2022.

Yanzhu Qi, et al., "An Ultrawideband Low-Profile High-Efficiency Indoor Antenna", IEEE, vol. 19, Issue 2, Feb. 29, 2020, pp. 346-349.

Sun Huanyong, et al., "The cloud-wavelet fault diagnosis of modular large scale integrated circuit", Application of Electronic Technique, Issue 12, Dec. 6, 2014, Full Text , English abstract.

* cited by examiner

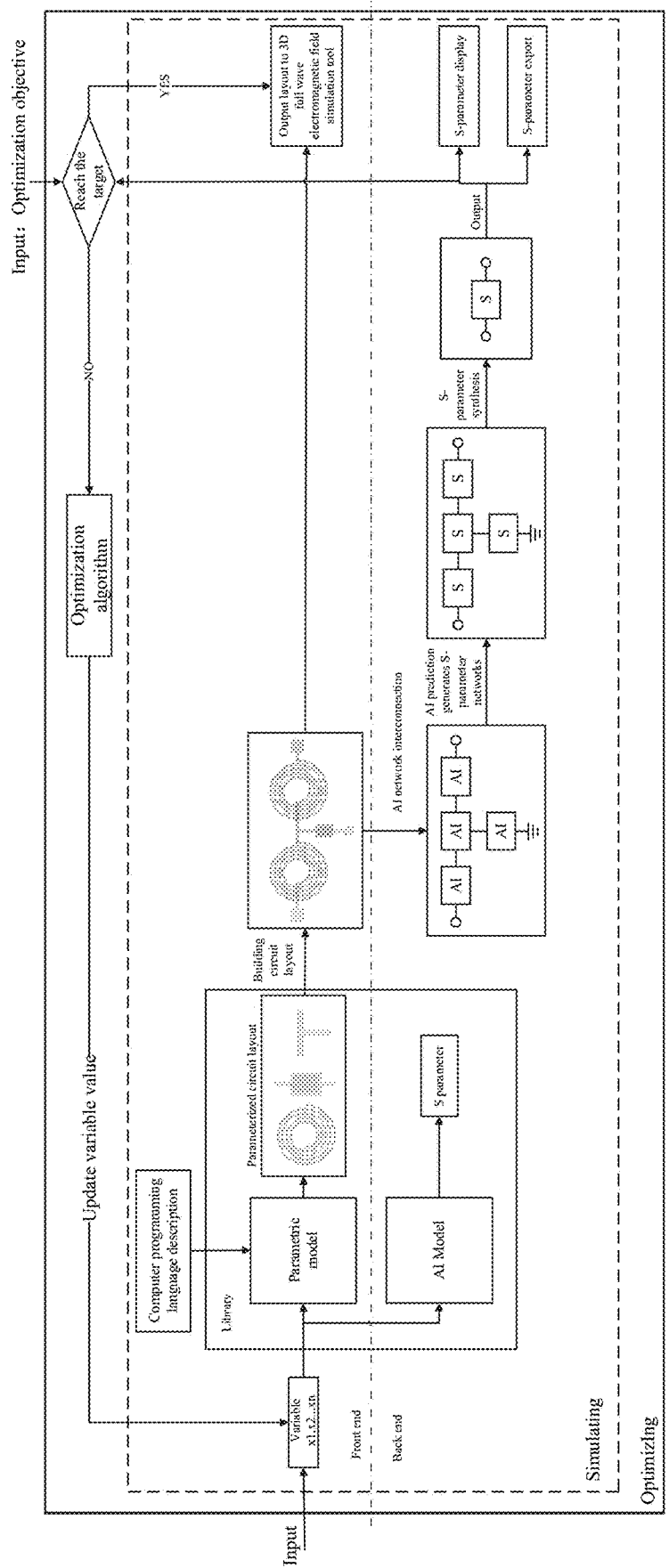

QUICK SIMULATION AND OPTIMIZATION METHOD AND SYSTEM FOR ANALOG CIRCUITS

CROSS-REFERENCE TO RELATED APPLICATIONS

The present disclosure is a continuation-application of International (PCT) Patent Application No. PCT/CN2022/090043, filed on Apr. 28, 2022, which claims priority of Chinese Patent Application No. 202210439728.9, filed on Apr. 25, 2022, the entire contents of which are hereby incorporated by reference in their entirety.

TECHNICAL FIELD

The present invention belongs to the technical field of software development, specifically refers to a quick simulation and optimization method and system for analog circuits, and particularly aims at a radio-frequency circuit.

BACKGROUND OF THE PRESENT INVENTION

In an analog circuit, particularly a radio-frequency circuit, the performance of the circuit is generally confirmed by simulation before actual processing of the circuit. At present, a commonly used method is to use an equivalent model of the circuit in a PDK library provided by a process manufacturer to build the circuit for simulation. However, there are two problems in this method. Firstly, a PDK model can only rely on a standardized model provided by the process manufacturer, but a user cannot customize a user-defined (customized) model, which limits the design of a customized radio-frequency circuit; secondly, the simulation of the radio-frequency circuit often depends on an electromagnetic field simulation software. The general electromagnetic field simulation software has high accuracy, but takes a long time to simulate, especially for a large-scale radio-frequency circuit system, the simulation will be very slow, and further circuit optimization based on a simulation result is even much slower, making circuit optimization prohibitively difficult. These problems have a key impact on circuit design.

SUMMARY OF THE PRESENT INVENTION

One purpose of the present invention is to provide a quick simulation and optimization method for analog circuits, aiming at a problem that a customized circuit model is difficultly modeled in a design process of the analog circuit, and the problem of a low circuit design efficiency caused by a slow electromagnetic field simulation speed. By creating an Artificial Intelligence (AI) model through an AI technology, the customized circuit model with an arbitrary structure can be modeled, and at the same time, higher model accuracy can be ensured. In addition, a rapid prediction function of the AI model is able to improve a circuit simulation speed, and thus giving full play to a role of rapid optimization of a circuit optimization method, improving circuit design efficiency, and finding a reasonable balance point between circuit design accuracy and a circuit design speed.

The technical solution adopted in the present invention is as follows.

A quick simulation and optimization method for analog circuits, comprising a presimulation process and an optimization process, wherein:

the presimulation process specifically comprises the following steps of:

step S1: constructing a device library, wherein the device library comprises a plurality of library units corresponding to different electronic components, and each library unit corresponds to one type of electronic component; and a parameterized model and an AI model are set in each library unit;

the parameterized model adopts a designated device described by a computer programming language, and is used for generating a circuit layout containing an actual physical size and a structure of the electronic component by using computer graphics according to an input variable;

the input variable is one or more of a length, a width, a space and a height of different structures in the electronic component;

the AI model adopts a deep learning network, which is used for predicting a network parameter of the corresponding electronic component according to the same input variable as the parameterized model, wherein the network parameter of the electronic component comprises one of a scattering parameter (S parameter), an admittance parameter (Y parameter) and an impedance parameter (Z parameter); and preferably, the deep learning network adopts a fully connected neural network;

step S2: building a circuit;

connecting the circuit layout generated by the parameterized model in the plurality of library units with the same type of electronic component or the different types of electronic components according to an actual demand to build circuit layout of an analog circuit; wherein the type of the input variable of the library unit of the same type of the electronic component is the same or different; and when the type of the input variable of the library unit of the same type of the electronic component is the same, the value of the input variable is the same or different;

step S3: interconnecting an AI network;

determining interconnection or disconnection of the parameterized model in each corresponding library unit according to an intersection relation of the circuit layout of the parameterized model in each library unit in the circuit layout of the analog circuit, and generating a netlist file describing the interconnection relation of the circuit layout of the plurality of library units; wherein the netlist file describing the interconnection relation of the circuit layout of the plurality of library units in the analog circuit refers to the interconnection of the AI model corresponding to each circuit layout to form the AI network corresponding to the circuit layout of the analog circuit; and the AI network synchronously makes corresponding modification according to addition, deletion and change of a connection mode of the parameterized model in the circuit layout of the analog circuit without retraining the AI model; according to the needs of circuit design, one or more AI models corresponding to the same parameterized model can be used in the circuit at the same time, and the value of the input variable of each AI model can be the same or different; and step S4: predicting and generating an S parameter network of each electronic component according to each AI model in the AI network, and finally obtaining a comprehensive network parameter; wherein the specific is as follows:

as each AI model in the AI network will generate one S parameter according to the input variable, all network parameters in the AI network are calculated by a mathematical method to obtain the comprehensive network parameter;

preferably, the mathematical method adopts a microwave network synthesis method; and the optimization process specifically comprises the following steps of: comparing with a network parameter target of the analog circuit whether the comprehensive network parameter in the simulation process to fall within a threshold range, if falling within the threshold range, outputting the circuit layout of the analog circuit corresponding to the AI network to a three-dimensional full-wave electromagnetic field simulation tool for simulation and verification; and if not falling within the threshold range, using an optimization algorithm to reset a value of the input variable in all or part of the parameterized model in each library unit in the circuit layout of the analog circuit, and carrying out the presimulation process again until the comprehensive network parameter meets optimization requirements.

Another purpose of the present invention is to provide a simulation and optimization system of the analog circuit, comprising:

a presimulation module, used for connecting the circuit layout generated by the parameterized model in the plurality of library units according to the actual demand to build the circuit layout of the analog circuit; determining interconnection or disconnection of the parameterized model in each corresponding library unit according to the intersection relation of the circuit layout of the parameterized model in each library unit in the circuit layout of the analog circuit, and generating a netlist file describing the interconnection relation of the circuit layout of the plurality of library units; and predicting and generating the S parameter network of each electronic component according to each AI model in the AI network, and finally obtaining the comprehensive network parameter; and an optimization module, comparing the comprehensive network parameter output by the presimulation module with the network parameter target of the analog circuit, if falling within the threshold range, outputting the circuit layout of the analog circuit corresponding to the AI network to the three-dimensional full-wave electromagnetic field simulation tool for the simulation and verification; and if not falling within the threshold range, using the optimization algorithm to reset the value of the input variables in all or part of the parameterized model in each library unit in the circuit layout of the analog circuit, and returning to the presimulation module for the presimulation until the comprehensive network parameter meets the optimization requirements.

The present invention has the beneficial effects.

(1) The present invention adopts the AI model to replace a PDK unit model, which can model the customized circuit model with the arbitrary structure, realize the rapid prediction of circuit results and ensure the high accuracy, and can quickly build the complex circuit with the arbitrary structure without retraining the AI model, thus effectively improving the use efficiency.

(2) The present invention adopts the AI model combined with the optimization algorithm, which can quickly optimize circuit performance, improve the circuit design efficiency, find a better initial value for three-dimensional full-wave electromagnetic field simulation, and greatly reduce a simulation time.

(3) By adopting the AI model, the present invention can quickly model the device under different processes, and can quickly migrate the device library model under one process to the other process.

DESCRIPTION OF THE DRAWINGS

FIG. 1 is a flow chart of a quick simulation and optimization method for an analog circuit.

DETAILED DESCRIPTION OF PREFERRED EMBODIMENTS

In order to more clearly explain the problems solved by the present invention, the technical scheme adopted and the beneficial effects, the detailed description of preferred embodiments of the present invention will be described below with an illustration. The preferred embodiments described herein are only used to illustrate and explain the present invention, and are not used to limit the present invention. All modifications, equivalent substitutions and improvements made within the spirit and principles of the present invention should be within the protection scope of the present invention.

Embodiment 1

As shown in FIG. 1, a quick simulation and optimization method for analog circuits comprise a presimulation process and an optimization process.

The presimulation process comprises the steps of constructing a device library, building a circuit, interconnecting an AI network and obtaining a comprehensive parameter;

step S1: constructing a device library, wherein the device library comprises a plurality of library units corresponding to different electronic components, and each library unit corresponds to one type of electronic component; a parameterized model and a corresponding AI model are set in each library unit, and the input variable is one or more of a length, a width, a space and a height of different structures in the electronic component, i.e., $x_1, x_2 \ldots x_n$;

the parameterized model adopts a designated device described by a computer programming language, and is used for generating a circuit layout containing an actual physical size and a structure of the electronic component by using computer graphics according to an input variable $x_1, x_2 \ldots x_n$; and the AI model adopts a deep learning network, which is used for predicting a network parameter of the corresponding electronic component according to the same input variable $x_1, x_2 \ldots x_n$ as the parameterized model, wherein the network parameter of the electronic component comprises one of a scattering parameter (S parameter), an admittance parameter (Y parameter) and an impedance parameter (Z parameter);

step S2: building a circuit;

connecting the circuit layout generated by the parameterized model in the plurality of library units with the same type of electronic component or the different types of electronic components according to an actual demand to build a circuit layout of an analog circuit; wherein the type of the input variable of the library unit of the same type of the electronic component is the same or different; and when the type of the input variable of the library unit of the same type of the electronic component is the same, the value of the input variable is the same or different;

step S3: interconnecting an AI network;

determining interconnection or disconnection of the parameterized model in each corresponding library unit according to an intersection relation of the circuit layout of the parameterized model in each library unit in the circuit layout of the analog circuit, and generating a netlist file describing the interconnection relation of the circuit layout of the plurality of library units; wherein the netlist file describing the interconnection relation of the circuit layout of the plurality of library units in the analog circuit refers to the interconnection of the AI model corresponding to each circuit layout to form the AI network corresponding to the circuit layout of the analog circuit; and the AI network synchronously makes corresponding modification according to addition, deletion and change of a connection mode of the parameterized model in the circuit layout of the analog circuit without retraining the AI model; according to the needs of circuit design, one or more AI models corresponding to the same parameterized model may be used in the circuit at the same time, and the value of the input variable of each AI model may be the same or different; and step S4: predicting and generating an S parameter network of each electronic component according to each AI model in the AI network, and finally obtaining a comprehensive network parameter; wherein the specific is as follows:

as each AI model in the AI network will generate one S parameter according to the input variable x1, x2 . . . xn, all network parameters in the AI network are calculated by a mathematical method to obtain the comprehensive network parameter, which is output to display by a network parameter curve, or is derived as a data file; and the optimization process specifically comprises the follow steps of: comparing with a network parameter target of the analog circuit whether the comprehensive network parameter in the simulation process to fall within a threshold range, if falling within the threshold range, outputting the circuit layout of the analog circuit corresponding to the AI network to a three-dimensional full-wave electromagnetic field simulation tool for simulation and verification; and if not falling within the threshold range, using an optimization algorithm to reset a value of the input variable in all or part of the parameterized model in each library unit in the circuit layout of the analog circuit, and carrying out the presimulation process again until the comprehensive network parameter met optimization requirements.

The above-mentioned embodiments are not limitations to the present invention, and the present invention is not limited to the above-mentioned embodiments, so long as the requirements of the present invention are met, the above embodiments shall fall within the protection scope of the present invention.

We claim:

1. A quick simulation and optimization method for analog circuits, comprising a presimulation process and an optimization process, wherein:

the presimulation process specifically comprises the following steps of:

step S1: constructing a device library, wherein the device library comprises a plurality of library units corresponding to different electronic components, and each library unit corresponds to one type of electronic component; and a parameterized model and an AI model are set in each library unit; wherein the parameterized model adopts a designated device described by a computer programming language, and is used for generating a circuit layout containing an actual physical size and a structure of the electronic component by using computer graphics according to an input variable;

the input variable is one or more of a length, a width, a space and a height of different structures in the electronic component; and the AI model adopts a deep learning network, which is used for predicting a network parameter of the corresponding electronic component according to the same input variable as the parameterized model, wherein the network parameter of the electronic component comprises one of a scattering parameter, an admittance parameter and an impedance parameter;

step S2: building a circuit which comprises:

connecting the circuit layout generated by the parameterized model in the plurality of library units with the same type of electronic component or the different types of electronic components according to an actual demand to build a circuit layout of an analog circuit;

step S3: interconnecting an AI network which comprises:

determining interconnection or disconnection of the parameterized model in each corresponding library unit according to an intersection relation of the circuit layout of the parameterized model in each library unit in the circuit layout of the analog circuit, and generating a netlist file describing the interconnection relation of the circuit layout of the plurality of library units; wherein the netlist file describing the interconnection relation of the circuit layout of the plurality of library units in the analog circuit refers to the interconnection of the AI model corresponding to each circuit layout to form the AI network corresponding to the circuit layout of the analog circuit; and step S4: predicting and generating an S parameter network of each electronic component according to each AI model in the AI network, and finally obtaining a comprehensive network parameter of the AI network by an optimization process which comprises the following steps of: comparing with a network parameter target of the analog circuit whether the comprehensive network parameter of the AI network in the presimulation process falls within a threshold range, if falling within the threshold range, outputting the circuit layout of the analog circuit corresponding to the AI network to a three-dimensional full-wave electromagnetic field simulation tool for simulation and verification; and if not falling within the threshold range, using an optimization algorithm to reset a value of the input variable in all or part of the parameterized model in each library unit in the circuit layout of the analog circuit, and carrying out the presimulation process again until the comprehensive network parameter of the AI network meets optimization requirements.

2. The quick simulation and optimization method for the analog circuits according to claim 1, wherein the deep learning network in the step S1 adopts a fully connected neural network in the presimulation process.

3. The quick simulation and optimization method for the analog circuits according to claim 1, wherein the type of the input variable of the library unit of the same type of the electronic component is the same or different in the step S2 of the presimulation process.

4. The quick simulation and optimization method for the analog circuits according to claim 3, wherein when the type of the input variable of the library unit of the same type of the electronic component is the same, the value of the input variable is the same or different.

5. The quick simulation and optimization method for the analog circuits according to claim 1, wherein the AI network synchronously makes corresponding modification according to addition, deletion and change of a connection mode of the parameterized model in the circuit layout of the analog circuit without retraining the AI model in the step S3 of the presimulation process.

6. The quick simulation and optimization method for the analog circuits according to claim 1, wherein the value of the input variable of each AI model is the same or different in the step S3 of the presimulation process.

7. The quick simulation and optimization method for the analog circuits according to claim 1, wherein the step S4 in the presimulation process is specifically: as each AI model in the AI network will generate an S parameter according to the input variable, all network parameters in the AI network are calculated by a mathematical method to obtain the comprehensive network parameter of the AI network.

8. The quick simulation and optimization method for the analog circuits according to claim 7, wherein the mathematical method adopts a microwave network synthesis method.

9. The quick simulation and optimization method for the analog circuits according to claim 1, wherein the optimization algorithm comprises one of a gradient descent method, a Newton and quasi-Newton method, a conjugate gradient method, a genetic algorithm, a particle swarm optimization algorithm and a reinforcement learning algorithm in the optimization process.

10. A quick simulation and optimization system for analog circuits for realizing the method according to claim 1, further comprising:

a presimulation module, used for connecting the circuit layout generated by the parameterized model in the plurality of library units according to the actual demand to build the circuit layout of the analog circuit; determining interconnection or disconnection of the parameterized model in each corresponding library unit according to the intersection relation of the circuit layout of the parameterized model in each library unit in the circuit layout of the analog circuit, and generating a netlist file describing the interconnection relation of the circuit layout of the plurality of library units; and predicting and generating the S parameter network of each electronic component according to each AI model in the AI network, and finally obtaining the comprehensive network parameter of the AI network; and an optimization module, used for comparing the comprehensive network parameter of the AI network output by the presimulation module with the network parameter target of the analog circuit, if falling within the threshold range, outputting the circuit layout of the analog circuit corresponding to the AI network to the three-dimensional full-wave electromagnetic field simulation tool for the simulation and verification; and if not falling within the threshold range, using the optimization algorithm to reset the value of the input variables in all or part of the parameterized model in each library unit in the circuit layout of the analog circuit, and returning to the presimulation module for the presimulation until the comprehensive network parameter of the AI network meets the optimization requirements.

* * * * *